US010573535B2

(12) United States Patent
Saido et al.

(10) Patent No.: US 10,573,535 B2
(45) Date of Patent: Feb. 25, 2020

(54) SUBSTRATE PROCESSING APPARATUS, LID COVER AND METHOD OF MANUFACTURING SEMICONDUCTOR DEVICE

(71) Applicant: HITACHI KOKUSAI ELECTRIC INC., Tokyo (JP)

(72) Inventors: Shuhei Saido, Toyama (JP); Mika Urushihara, Toyama (JP); Yusaku Okajima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 13 days.

(21) Appl. No.: 15/659,967

(22) Filed: Jul. 26, 2017

(65) Prior Publication Data

US 2018/0033645 A1 Feb. 1, 2018

(30) Foreign Application Priority Data

Jul. 26, 2016 (JP) ................................ 2016-146276

(51) Int. Cl.
*H01L 21/443* (2006.01)
*H01L 21/67* (2006.01)
(Continued)

(52) U.S. Cl.
CPC ...... *H01L 21/443* (2013.01); *H01L 21/67017* (2013.01); *H01L 21/67051* (2013.01); (Continued)

(58) Field of Classification Search
None
See application file for complete search history.

(56) References Cited

U.S. PATENT DOCUMENTS 5,846,073 A * 12/1998 Weaver .................. C30B 31/10 432/241
8,590,484 B2 11/2013 Sato et al.
(Continued)

FOREIGN PATENT DOCUMENTS

JP 2005-159249 A 6/2005
JP 2010-123624 A 6/2010
JP 2014-053492 A 3/2014

OTHER PUBLICATIONS

Japanese Office Action dated Jun. 17, 2019 for the Japanese Patent Application No. 2016-146276.

*Primary Examiner* — Jethro M. Pence
(74) *Attorney, Agent, or Firm* — Volpe and Koenig, P.C.

(57) ABSTRACT

A technique capable of preventing by-products from adhering to a lower portion of a process vessel utilizes a substrate processing apparatus including: a process vessel having a process chamber; a lid configured to close a lower end opening of the process vessel; a substrate retainer; an insulating structure; a process gas supply mechanism configured to supply a process gas; a purge gas supply unit configured to supply a purge gas to a lower region of the process vessel via a gap between the insulating structure and the lid; and a restrictor disposed in the gap. The restrictor regulates flow of the purge gas such that the flow rate of the purge gas supplied to a first portion of the lower region of the process vessel is greater than a flow rate of the purge gas supplied to a second portion of the lower region of the process vessel.

9 Claims, 17 Drawing Sheets

2 10 26 12 14 44b 16 100 CONTROLLER MEMORY UNIT 104 INPUT/OUTPUT DEVICE 102 13 W 34 38d 40d 36d 38b 40b 44a 44c 20 24 48 46 50 52 36b 36a 38a 40a 18A 28 18 36c 38c 40c 40e 38e 36e 60 22 30A 62 32 40f 38f 36f 30

(51) Int. Cl.
*H01L 21/677* (2006.01)
*H01L 21/8238* (2006.01)

(52) U.S. Cl.
CPC .. *H01L 21/67109* (2013.01); *H01L 21/67126* (2013.01); *H01L 21/67772* (2013.01); *H01L 21/823878* (2013.01)

(56) References Cited

U.S. PATENT DOCUMENTS

| | | | | |
|---|---|---|---|---|
| 9,394,607 | B2 | 7/2016 | Nishida et al. | |
| 9,401,272 | B2 | 7/2016 | Terasaki et al. | |
| 2014/0072924 | A1 | 3/2014 | Kaneko et al. | |
| 2014/0287594 | A1* | 9/2014 | Terasaki ............ | H01L 21/02164<br>438/770 |
| 2016/0284539 | A1 | 9/2016 | Horita et al. | |
| 2017/0037512 | A1 | 2/2017 | Saido et al. | |
| 2017/0088948 | A1 | 3/2017 | Takagi et al. | |

* cited by examiner

MEMORY UNIT
104
CONTROLLER
100
INPUT/OUTPUT DEVICE
102
12
16
26
14
W
10
2
13
44b
44a
44c
24
20
18A
18
46
48
50
52
32
62
28
30
30A
22
60
40f
38f
36f
40e
38e
36e
40d
40b
40a
40c
38d
38b
38a
38c
34
36d
36b
36a
36c

MEMORY UNIT
104
CONTROLLER
INPUT/OUTPUT DEVICE
102
100
52
50
48
46
32
10B
24
24A
24B
26
W
14
10
70
30A
10E
10A
44b
44a
44c
60
62
30C
30B
30
40f
38f
36f
40e
38e
36e
2
12
40d
40b
40a
40c
38d
38b
38a
38c
34
36d
36b
36a
36c

SUBSTRATE PROCESSING APPARATUS, LID COVER AND METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of Japanese Patent Application No. 2016-146276, filed on Jul. 26, 2016, in the Japanese Patent Office, the entire contents of which are hereby incorporated by reference.

BACKGROUND

1. Field

The present disclosure relates to a substrate processing apparatus, a lid cover and a method of manufacturing a semiconductor device.

2. Description of the Related Art

Substrate processing, which is one of semiconductor device manufacturing processes, is performed using a vertical type substrate processing apparatus that batch-processes a plurality of substrates. When the substrate processing is performed using the vertical type substrate processing apparatus, particles are produced when by-products are adhered to a lower portion of a process vessel.

When particles are produced in the lower portion of the process vessel, the film formation is adversely affected.

SUMMARY

Described herein is a technique capable of preventing by-products from adhering to a lower portion of a process vessel.

According to one aspect of the technique described herein, there is provided a substrate processing apparatus including: a process vessel including a process chamber wherein a plurality of substrates are processed; a lid configured to close a lower end opening of the process vessel; a substrate retainer configured to accommodate the plurality of substrates in the process chamber; an insulating structure disposed between the lid and the substrate retainer; a process gas supply mechanism configured to supply a process gas into the process vessel; a purge gas supply unit configured to supply a purge gas to a lower region of the process vessel via a gap between the insulating structure and the lid; and a restrictor disposed in the gap, wherein the restrictor is configured to regulate a flow of the purge gas such that a flow rate or a conductance of the purge gas supplied to a first portion of the lower region of the process vessel is greater than a flow rate or a conductance of the purge gas supplied to a second portion of the lower region of the process vessel other than the first portion.

DETAILED DESCRIPTION

Figure 1:
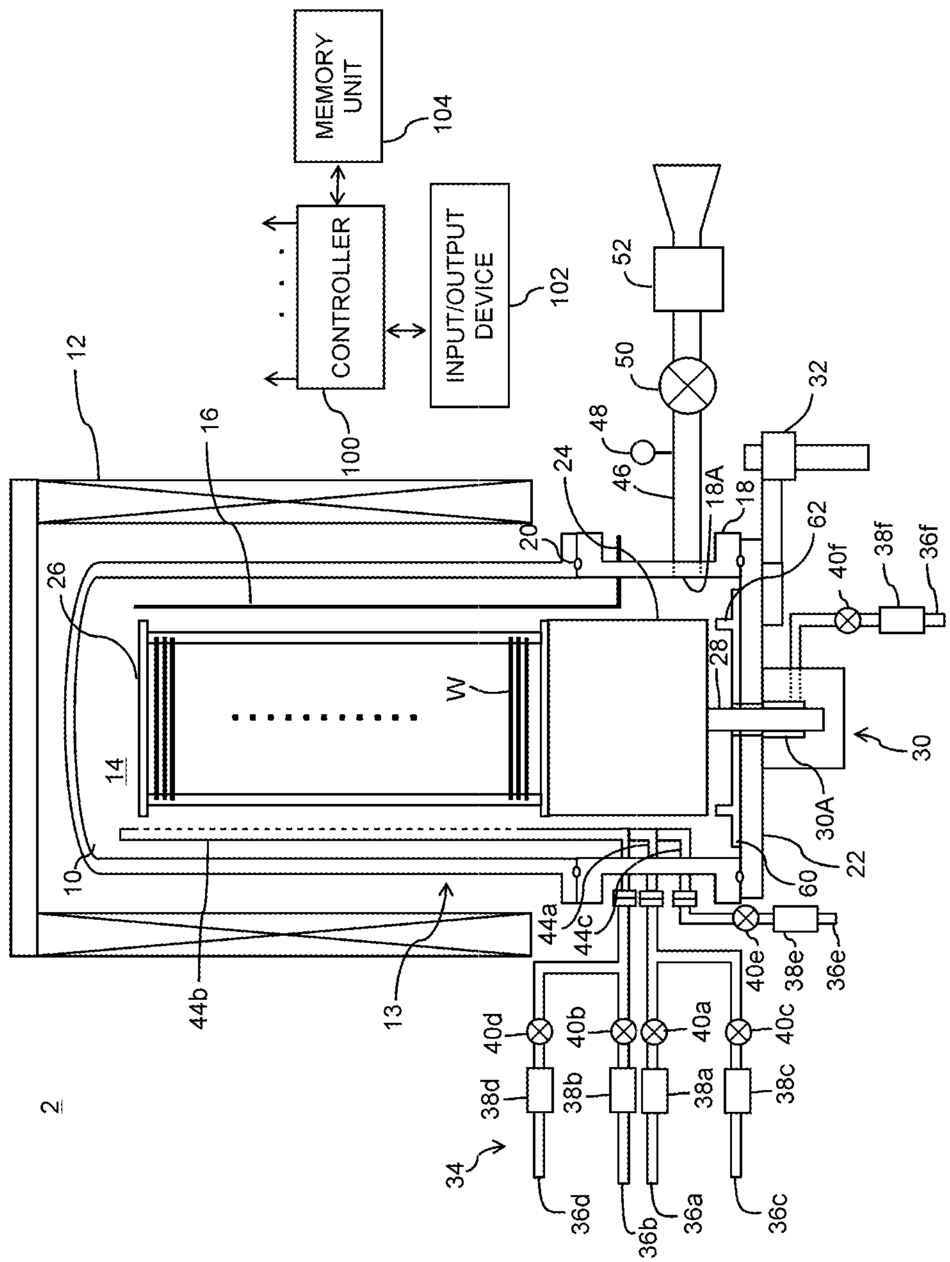
FIG. 1 schematically illustrates a vertical cross-section of a substrate processing apparatus according to a first embodiment.

A first embodiment will be described below by way of example with reference to the accompanying drawings. In the drawings, like reference numerals represent like components and detailed descriptions of redundant components will be omitted.

A substrate processing apparatus according to the first embodiment includes a vertical type substrate processing apparatus 2 (hereinafter also referred to simply as a "processing apparatus") that performs substrate processing such as thermal treatment, which is one of the semiconductor device manufacturing processes. As shown in FIG. 1, the processing apparatus 2 includes a cylindrical reaction tube 10 and a heater 12 which is a heating mechanism provided at the outer periphery of the reaction tube 10. The reaction tube 10 is made of a material such as quartz and silicon carbide (SiC). A temperature detecting unit 16, which is a temperature detector, is provided in the reaction tube 10. The temperature detecting unit 16 is provided along the inner wall of the reaction tube 10.

A cylindrical manifold 18 is connected to an opening at the lower end of the reaction tube 10 via a sealing member 20 such as an O-ring. The manifold 18 supports the reaction tube 10 from thereunder. The manifold 18 is made of a metal such as stainless steel. The process vessel 13 is constituted by the reaction tube 10 and the manifold 18. A process chamber 14 in which the wafer (substrate) W is processed is provided in the process vessel 13. The opening at the lower end of the manifold 18 (the opening at the lower end of the process vessel 13) may be closed by a disc-shaped lid 22. The lid 22 is made of, for example, metal. A sealing member (not shown) such as an O-ring is provided on the upper surface of the lid 22. The reaction tube 10 is hermetically sealed by the sealing member (not shown). A lid cover 60, which is to be described later, is provided on the upper surface of the lid 22. A hole is provided at the center of the lid 22. A rotating shaft 28, which is to be described later, is inserted into the hole.

A boat 26, which is a substrate retainer for vertically supporting a plurality of wafers (e.g., 25 to 150 wafers) in multiple stages, may be accommodated in the process chamber 14. The boat 26 is made of a material such as quartz and SiC. The boat 26 is disposed on an insulating structure 24. A substrate support is constituted by the boat 26 and the insulating structure 24. The insulating structure 24 is cylindrical. The insulating structure 24 is supported by the rotating shaft 28 which penetrates the lid 22. The rotating shaft 28 is connected to a rotating mechanism 30 provided below the lid 22. For example, a magnetic fluid seal (not shown) is provided at a portion where the rotating shaft 28 penetrates the lid 22 to hermetically seal the inside of the reaction tube 10 while the rotating shaft 28 is rotated. The insulating structure 24 and the boat 26 are rotated by rotating the rotating shaft 28. The lid 22 is moved up and down by a boat elevator 32 which is an elevating mechanism. The substrate support and the lid 22 are thereby moved up and down together, and the boat 26 is loaded into or unloaded from the reaction tube 10.

The processing apparatus 2 includes a gas supply mechanism 34 configured to supply process gases used for substrate processing, such as source gas, reactive gas and inert gas, into the process chamber 14. The process gas supplied by the gas supply mechanism 34 may be changed depending on the type of the film to be formed. According to the first embodiment, the gas supply mechanism 34 includes a source gas supply unit, a reactive gas supply unit, an inert gas supply unit and a furnace opening purge gas supply unit.

The source gas supply unit includes a gas supply pipe 36*a*. A mass flow controller (MFC) 38*a* which is a flow rate controller and a valve (on/off valve) 40*a* are provided at the gas supply pipe 36*a* in order from the upstream side to the downstream side of the gas supply pipe 36*a*. The gas supply pipe 36*a* is connected to a gas nozzle 44*a* which penetrates a sidewall of the manifold 18. The gas nozzle 44*a* vertically extends in the reaction tube 10. A plurality of supply ports open toward the wafer W supported by the boat 26 are provided in the gas nozzle 44*a*. The source gas is supplied to the wafer W through the plurality of supply ports of the gas nozzle 44*a*.

The reactive gas supply unit, the inert gas supply unit and the furnace opening purge gas supply unit, which are similar to the source gas supply unit, will be described below. The reactive gas supply unit includes a gas supply pipe 36*b*. A mass flow controller (MFC) 38*b* which is a flow rate controller and a valve (on/off valve) 40*b* are provided at the gas supply pipe 36*b* in order from the upstream side to the downstream side of the gas supply pipe 36*b*. The reactive gas is supplied to the wafer W via the MFC 38*b* and the valve 40*b* provided in the gas supply pipe 36*b*, and the gas nozzle 44*b*. The inert gas supply unit includes gas supply pipes 36*c*, 36*d* and 36*e*. The inert gas is supplied to the wafer W via MFCs 38*c*, 38*d* and 38*e* and valves 40*c*, 40*d* and 40*e* provided at the gas supply pipes 36*c*, 36*d* and 36*e*, respectively, and gas nozzles a0*c*, 40*b* and 40*c*.

The furnace opening purge gas supply unit includes a gas supply pipe 36*f*. A MFC 38*f* and a valve 40*f* are installed in order from the upstream side to the downstream side of the gas supply pipe 36*f*. The gas supply pipe 36*f* is connected to a hollow portion 30A provided around the rotating shaft 28. The hollow portion 30A is sealed by the magnetic fluid seal but is in communication with the reaction tube 10. The hollow portion 30A and the upper surface of the lid cover 60 are in communication. A purge gas is supplied to the lower portion of the process vessel 13, i. e. the furnace opening through a gas supply port 60B (shown in FIG. 2) at the upper surface of the lid cover 60A and a gap between the insulating structure 24 and the lid 22. The periphery of the rotating shaft 28 is purged at the upstream side of the purge gas and the periphery of the manifold 18 at the furnace opening is purged at the downstream side of the purge gas. The purge gas is finally exhausted through an exhaust port 18A. Preferably, the purge gas does not react with the source gas or the reactive gas.

An exhaust pipe 46 is connected to the exhaust port 18A of the manifold 18. A vacuum pump 52, which is a vacuum exhaust device, is connected to the exhaust pipe 46 via a pressure sensor 48 serving as a pressure detecting unit configured to detect the inner pressure of the process chamber 14 and an APC (automatic pressure controller) valve 40. The inner pressure of the process chamber 14 may be adjusted to a pressure suitable for substrate processing by these components. The exhaust pipe 46 is provided at a position opposite to the gas nozzles 44*a* through 44*c*.

A controller 100 is connected to and controls the rotating mechanism 30, the boat elevator 32, the MFCs 38*a* through 38*f* and the valves 40*a* through 40*f* and an APC valve 50 of the gas supply mechanism 34. For example, the controller 100 is embodied by a microprocessor (computer) having a CPU, and is configured to control the operations of the processing apparatus 2. An input/output device 102 such as a touch panel is connected to the controller 100.

The memory unit 104, which is a storage medium, is connected to the controller 100. A control program for controlling the operations of the processing apparatus or a program (also referred to as a recipe) for controlling components of the processing apparatus 2 according to process conditions to perform processing is readably stored in the memory unit 104.

The memory unit 104 may be embodied by a built-in storage device (hard disk or flash memory) of the controller 100 or a portable external recording device (e, g, magnetic tapes, magnetic disks such as a flexible disk and a hard disk, optical discs such as CD and DVD, magneto-optical discs such as MO, and semiconductor memories such as USB memories and memory cards). The program may be provided to the computer using a communication means such as the Internet and a dedicated line. The program is read from the memory unit 104 by instructions such as input from the input/output device 102. The processing apparatus 2 performs the desired processing according to the recipe when the controller 100 executes the recipe.

The lid cover 60 is provided on the upper surface of the lid 22. The lid cover 60 is made of a heat-and-corrosion-resistant material such as quartz. The process gas is prevented from contacting the lid 22 by covering the metal lid 22 with the lid cover 60. As a result, the lid 22 is free from corrosion and deterioration by the process gas. The lid cover 60 may be thin since any mechanical strength is not required. The lid cover 60 may not be an independent part. For example, the lid cover 60 may be a thin film or layer of nitride coated on the upper surface of the lid 22.

Figure 2:
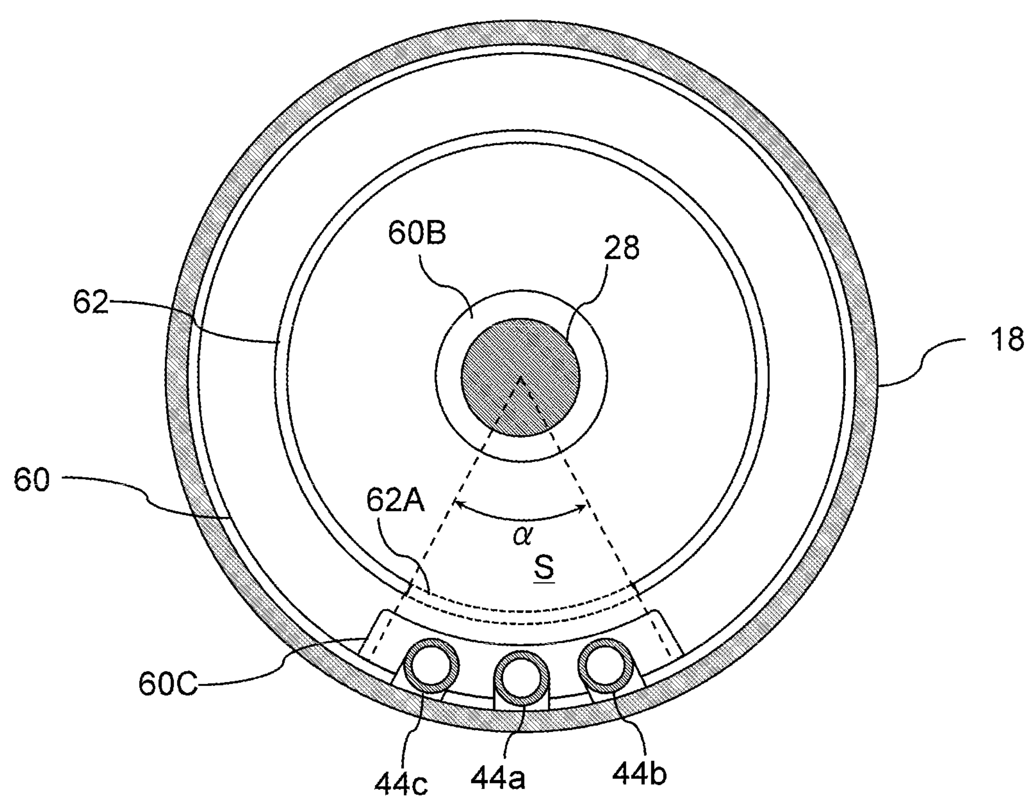
FIG. 2 schematically illustrates a horizontal cross-section of a furnace opening of the substrate processing apparatus according to the first embodiment.

As shown in FIG. 2, the gas supply port 60B, which is a round hole, is provided at the center of the lid cover 60. The rotating shaft 28 is inserted into the gas supply port 60B. The diameter of the gas supply port 60B is larger than that of the rotating shaft 28. The gas supply port 60B communicates with the hole of the lid 22 and the hollow portion 30A. When seen from above, the gas supply port 60B is annular with the rotating shaft 28 inserted therein. The purge gas is ejected through the gas supply port 60B and the hollow portion 30A in communication therewith. A countersink 60C is provided on a portion of the lid cover 60 around the gas nozzles 44*a*, 44*b* and 44*c*. In order to avoid interference with the bases of the gas nozzles 44*a*, 44*b* and 44*c* (the portion of the gas nozzle 44*a* through 44*c* connected to the manifold 18), the surface of the countersink 60C is lower than the lower ends of the gas nozzles 44*a*, 44*b* and 44*c*.

The furnace opening is purged by the purge gas supplied through the gas supply port 60B and flowing in all directions, i.e. radially, in the gap between the lid 22 and the lowermost surface of the insulating structure 24. The furnace opening is a lower temperature region in the lower portion of the process vessel 13 below the wafer processing region where the boat 26 is located and is typically the region where the bases of the gas nozzles 44*a* through 44*c* are located. Specifically, the furnace opening may also be referred to as the lower portion of the process vessel 13 (region defined by the lower portion of the reaction tube 10 and the manifold 18).

Figure 3:
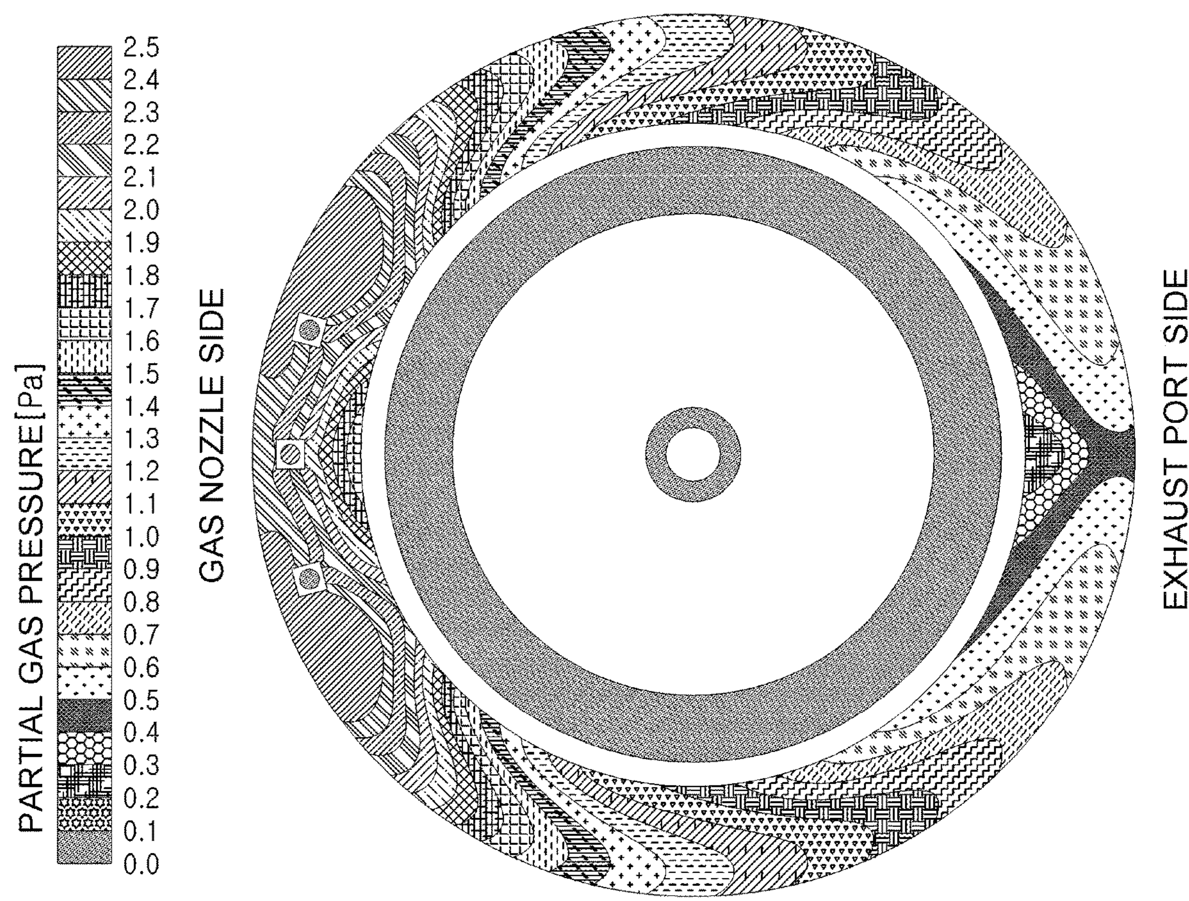
FIG. 3 illustrates a gas concentration distribution in a conventional furnace opening.
Figure 16:
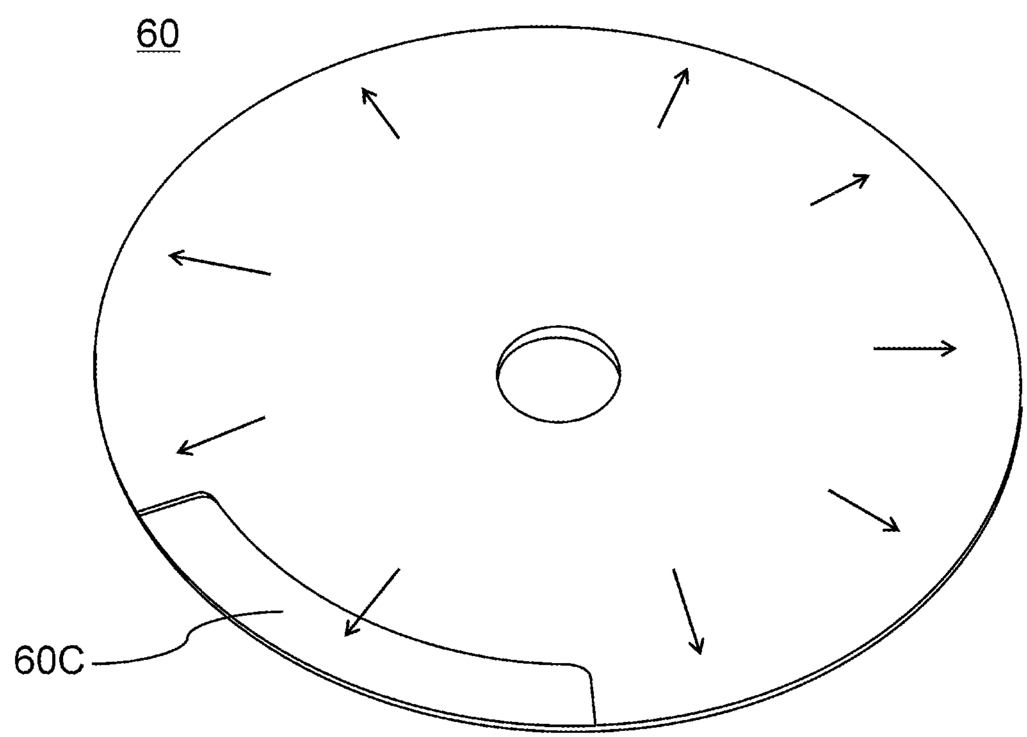
FIG. 16 is a perspective view of a conventional lid cover.

Next, the adhesion of by-products to the furnace opening will be described. FIG. 16 illustrates a conventional lid cover, and FIG. 3 illustrates a gas concentration distribution about the furnace opening where the conventional lid cover shown in FIG. 3 is installed. As shown in FIG. 3, the gas concentration (partial gas pressure) at the base portion of the gas nozzle (gas nozzle side) directly below the gas nozzle opposite to the exhaust port 18A of the furnace opening is higher than that of the opposite side (exhaust port side). As a result, the by-products are significantly attached to the base portion. In this case, the partial gas pressure (gas concentration) at the gas nozzle side was over 1 Pa. Since the gas concentration at the exhaust port side is lower than that of the gas nozzle side, the by-products are substantially not attached to the exhaust port side. That is, the partial gas pressure (gas concentration) at the exhaust port side was lower than 1 Pa. It may concluded that the by-products may be prevented from adhering to the furnace opening when the partial gas pressure (gas concentration) at the furnace opening is lower than a predetermined value (e.g., less than 1 Pa).

The reason for the low gas concentration at the exhaust port side is that the purge gas tends to flow easily toward the exhaust port 18A. On the other hand, as the purge gas tends to flow toward the exhaust port 18A, the purge gas is not sufficiently supplied to the gas nozzle resulting in high gas concentration at the gas nozzle side. Therefore, by supplying the purge gas to the gas nozzle side at a sufficient flow rate to dilute the gas at the gas nozzle side, the gas concentration at the gas nozzle side may be reduced to be lower than the predetermined value.

Figure 4:
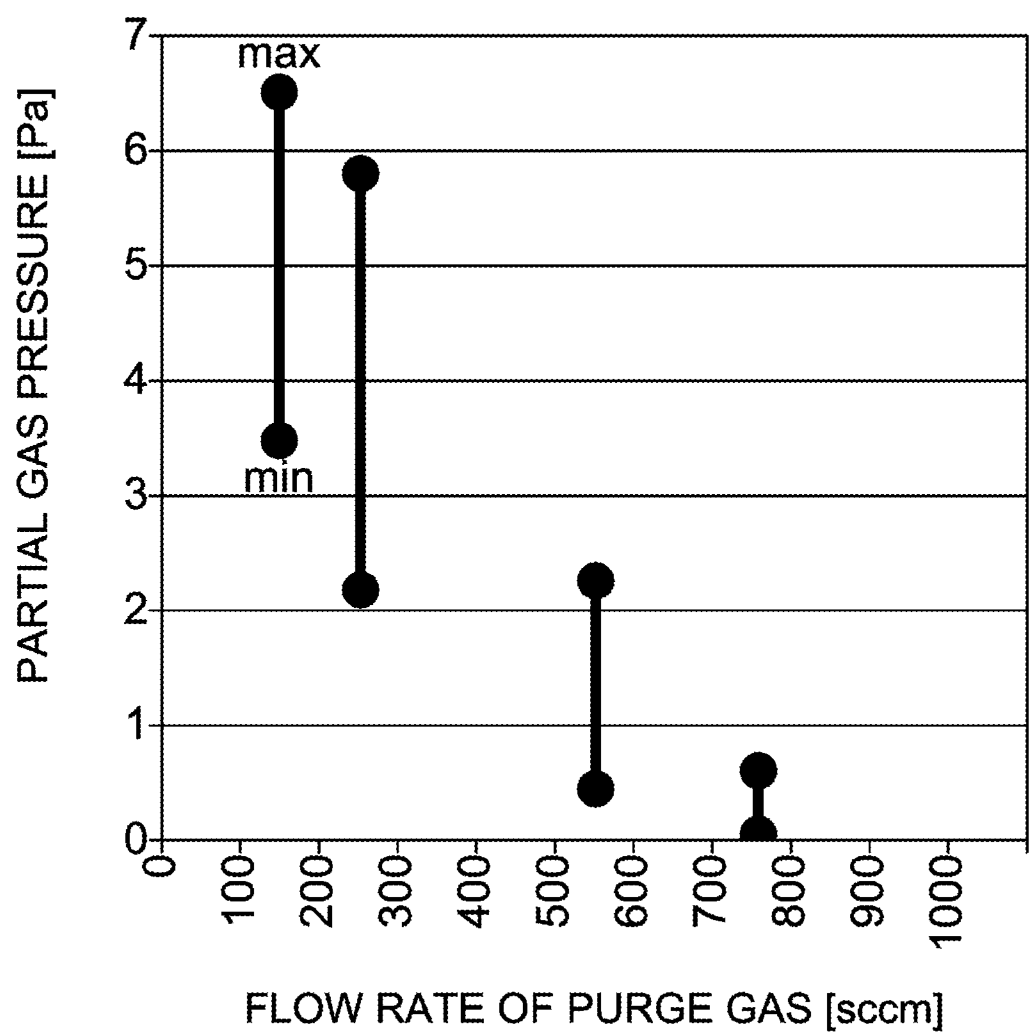
FIG. 4 illustrates a relationship between a gas concentration and a flow rate of a purge gas at the conventional furnace opening.
Figure 5:
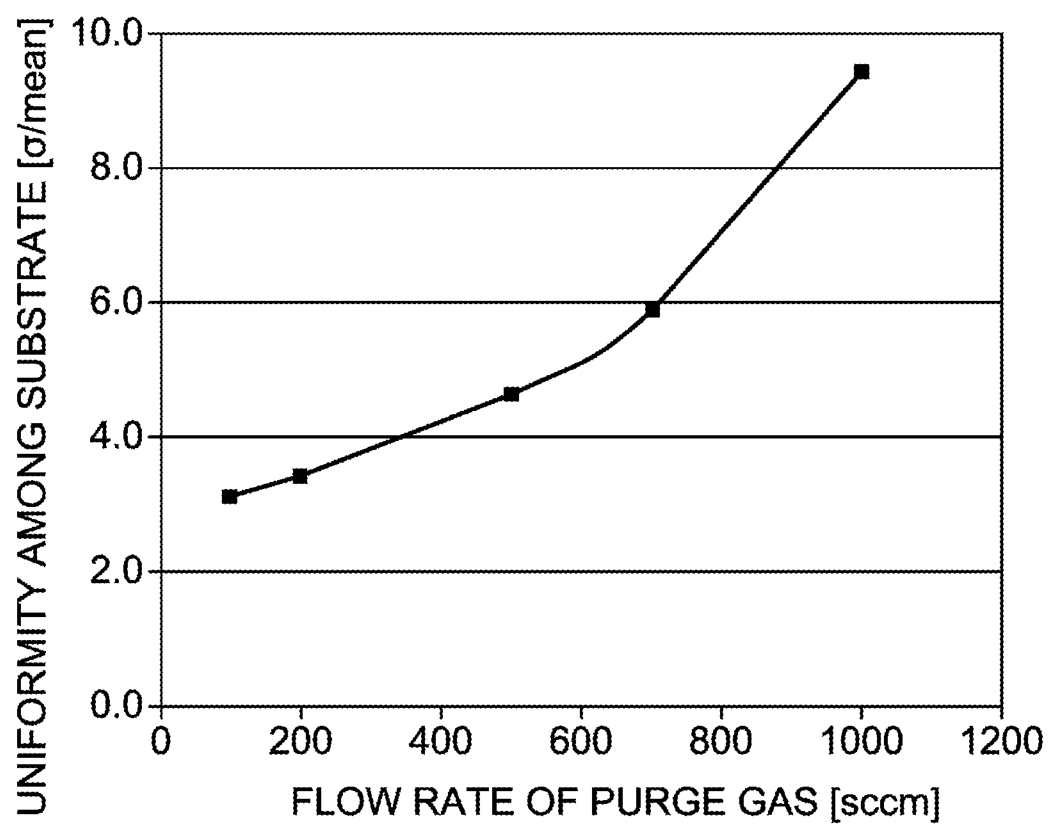
FIG. 5 illustrates a relationship between the flow rate of the purge gas and the uniformity among the substrates at the conventional furnace opening.

As shown in FIG. 4, as the flow rate of the purge gas increases, the partial gas pressure of the furnace opening decreases. However, as shown in FIG. 5, when the flow rate of the purge gas is greater than the predetermined value (e.g., greater than 500 sccm), the purge gas at the furnace opening reaches the wafer processing region, resulting in adverse effects on the uniformity of the film (e. g., uniformity between films formed on substrates). It is preferable that the flow rate of the purge gas is less than 500 sccm in order to maintain the quality of the film-forming process. However, when the flow rate of the purge gas is less than 500 sccm, the gas concentration at the furnace opening may be greater than the predetermined value (e.g., 1 Pa) as shown in FIG. 4, and by-products may be attached to the furnace opening.

The inventors of the present invention have confirmed that the by-products may be suppressed from attaching to the entire furnace opening without adversely affecting the film-forming process by adjusting the flow rate of the purge gas supplied to the portion of the furnace opening having high gas concentration (e.g., the periphery of the base of the gas nozzles to which the by-products are very likely to adhere) to be higher than that of the purge gas supplied to other parts of the furnace opening, i. e. by locally increasing the flow rate of the purge gas supplied to the periphery of the base of the gas nozzles. The inventors also confirmed that the flow rate of the purge gas may be locally increased by providing a restrictor, which interferes with the flow of the purge gas, in the flow path of the purge gas in the gap between the insulating structure and the lid.

Figure 6:
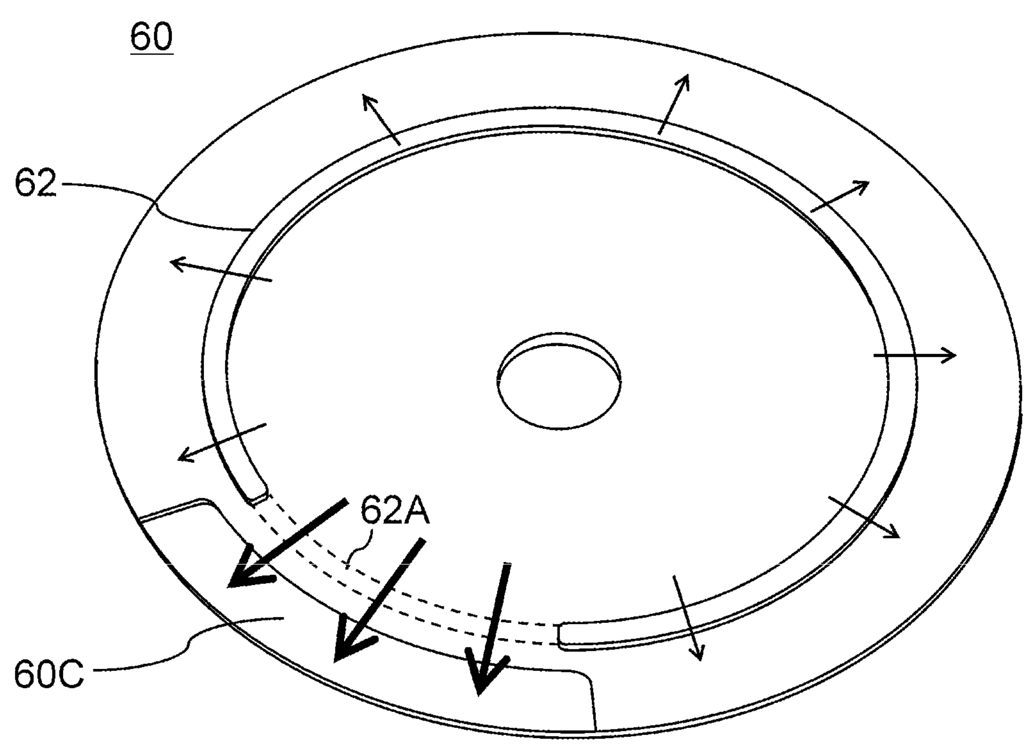
FIG. 6 is a diagram schematically illustrating a perspective view of a lid cover of the substrate processing apparatus according to the first embodiment.

Hereinafter, a restrictor provided on the lid cover 60 for locally increasing the flow rate of the purge gas will be described. As shown in FIG. 6, a restrictor 62 is provided on the upper surface of the lid cover 60. The restrictor 62 controls the flow of the purge gas such that the purge gas flows in a desired manner. The restrictor 62 may control the flow of the purge gas by partially narrowing the flow path of the purge gas defined by a gap between the insulating structure 24 and the lid 22. When viewed from above, the restrictor 62 has a ring shape with a portion thereof removed, i.e. an arc-shape. The restrictor 62 protrudes from the upper surface of the lid cover 60 in a band shape. That is, the restrictor 62 is a wall vertically protruding portion of the upper surface of the lid cover 60. The gap between the insulating structure 24 and the lid cover 60 is narrowed by the restrictor 62 protruding toward the insulating structure 24. The flow of the purge gas decreases at the region where the restrictor 62 is provided. The restrictor 62 may be provided on the lid 22 when the lid cover 60 is not employed. In this case, the gap between the insulating structure 24 and the lid 22 is narrowed.

The gap between the insulating structure 24 and the lid cover 60 is larger in the region where the portion of the restrictor 62 is removed, i.e. a notch 62A than in the region with the restrictor 62. This structure prevents the gas from flowing toward the exhaust port 18A, which exists in the conventional configuration. That is, the radial and outward flow of the gas is restricted by the restrictor 62, and the gas mainly flows within the space defined by the restrictor 62 toward the notch 62A. The gas may flow toward the notch 62A along the inner wall of the restrictor 62. When the flow of purge gas is sufficiently regulated by the restrictor 62, the flow rate of the purge gas flowing through the notch 62A is higher than that of the purge gas flowing within the space defined by the restrictor 62. That is, the conductance of the purge gas through the notch 62A is greater than the conductance of the purge gas through the restrictor 62. Accordingly, the flow rate or the flow velocity of the inert gas supplied to the furnace opening may be partially increased. That is, the region near the base of the gas nozzles of the furnace opening may be purged strongly. In other words, the purge gas flowing through the gap between the insulating structure 24 and the lid cover 60 may have different flow rates depending on the location such that the purge gas may be supplied intensively in a desired direction. The purge gas discharged toward the base of the gas nozzles then flows toward the exhaust port along the inner wall of the manifold 18 such that a region corresponding to the portion where the emission of the purge gas is reduced by the restrictor 62 (the portion other than the notch 62A) may be sufficiently purged by the purge gas flowing toward the exhaust port.

As described above, by making the gap at the portion where the purge gas should flow intensively large and making the gap at other portions small (narrowing the flow path of the purge gas), a difference in conductance along the circumferential direction may be obtained. As a result, the purge gas with a larger flow rate may be supplied to the portion (the notch 62A) where the purge gas should flow intensively. Preferably, for example, the gap between the lid cover 60 and the insulating structure 24 is 6 mm, and the gap between the restrictor 62 and the insulating structure 24 is 2.5 mm. When the gap between the restrictor 62 and the insulating structure 24 is less than 2.5 mm, the restrictor 62 and the insulating structure 24 may come in contact and be damaged.

Viewed from above, the diameter of the restrictor 62 is larger than the diameter of the gas supply port 60B and smaller than the diameter of the lid cover 60. Preferably, the diameter of the restrictor 62 is equal to or smaller than the outer diameter of the insulating structure 24 or slightly greater than the outer diameter of the insulating structure 24. As the diameter of the restrictor 62 decreases, the size of the notch 62A (opening area) should be increased to regulate the flow of the purge gas toward the notch 62A to which the purge gas should flow intensively. As the diameter of the restrictor 62 increases, the size of the notch 62A (opening area) should be decreased to regulate the flow of the purge gas toward the notch 62A to which the purge gas should flow intensively.

Figure 7:
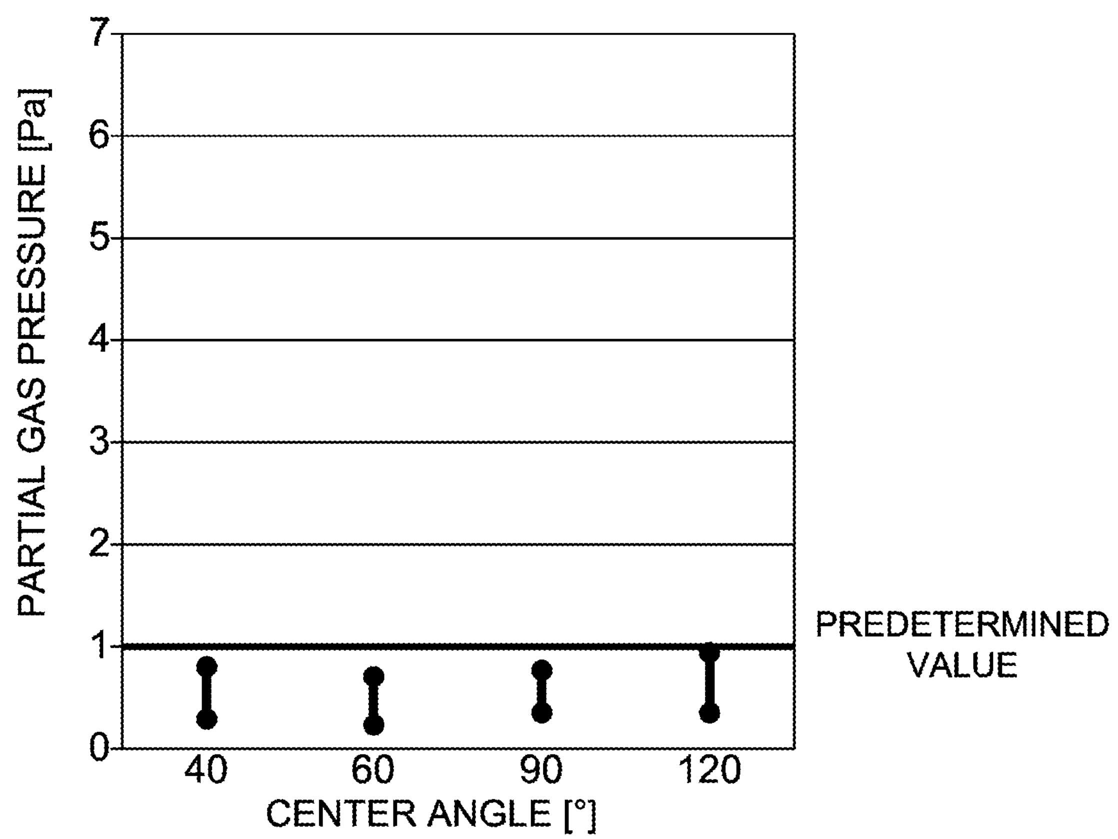
FIG. 7 illustrates a relationship between a size of a notch of a lid cover and the gas concentration at the furnace opening.
Figure 8:
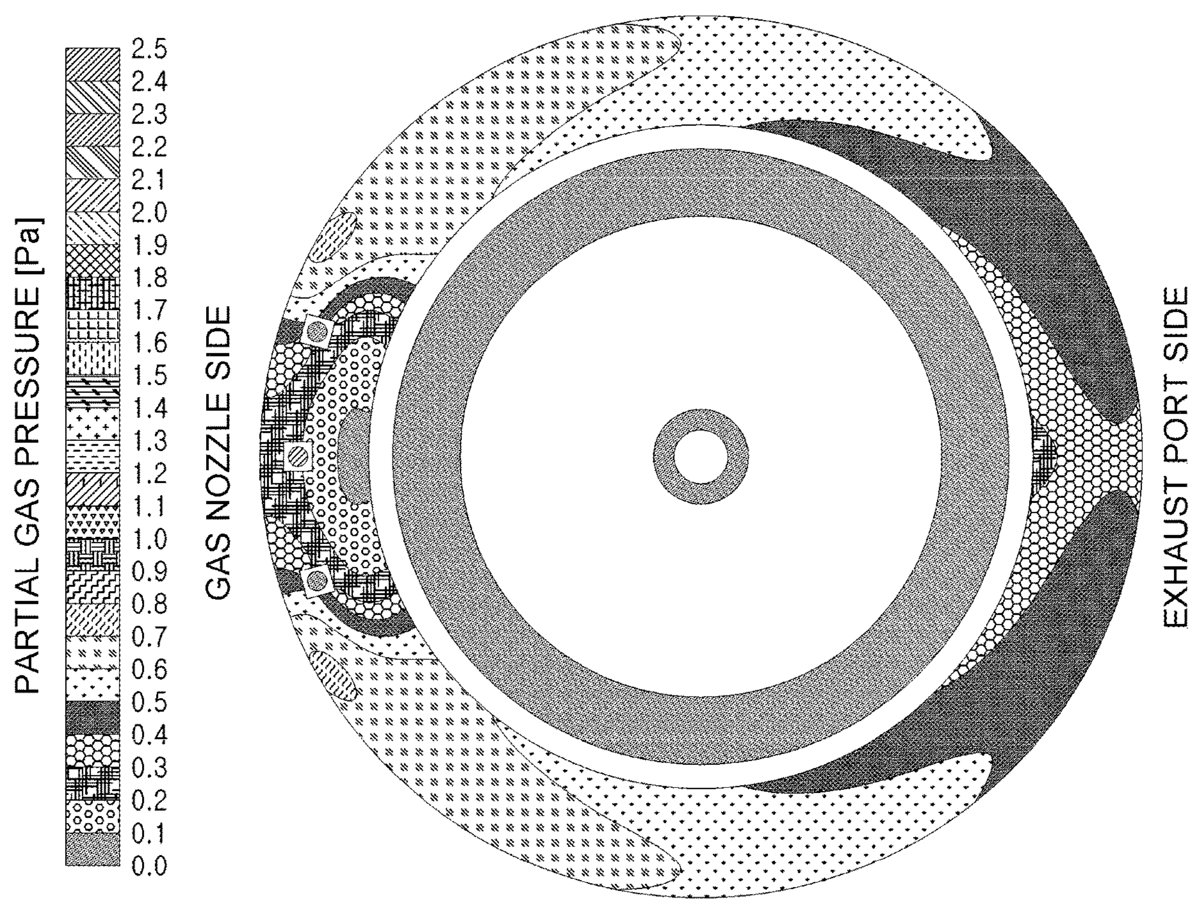
FIG. 8 illustrates a gas concentration distribution at a furnace opening according to the first embodiment.

As shown in FIG. 2, for example, the notch 62A is provided at a arc of a sector S defined by lines connecting the center of the lid 22 (the center of the lid cover 60) to the both ends of the region with high gas concentration, which is to be locally purged. The region with high gas concentration at least includes a region wherein the base of the gas nozzle 44*a* supplying at least the source gas is located. According to the first embodiment, the center angle (release angle) $\alpha$ of the sector S is, for example, 60 degrees. Preferably, the center angle $\alpha$ is greater than 0° and less than 120°. As shown in FIG. 7, when the center angle $\alpha$ is greater than 120°, the gas concentration may exceed the predetermined value such that by-products may be attached to the inside of the process vessel.

The restrictor 62 may be tapered and the corner of the restrictor 62 may be rounded to suppress the stagnation of the gas about the restrictor 62 while regulating the flow of the purge gas.

Figure 17:
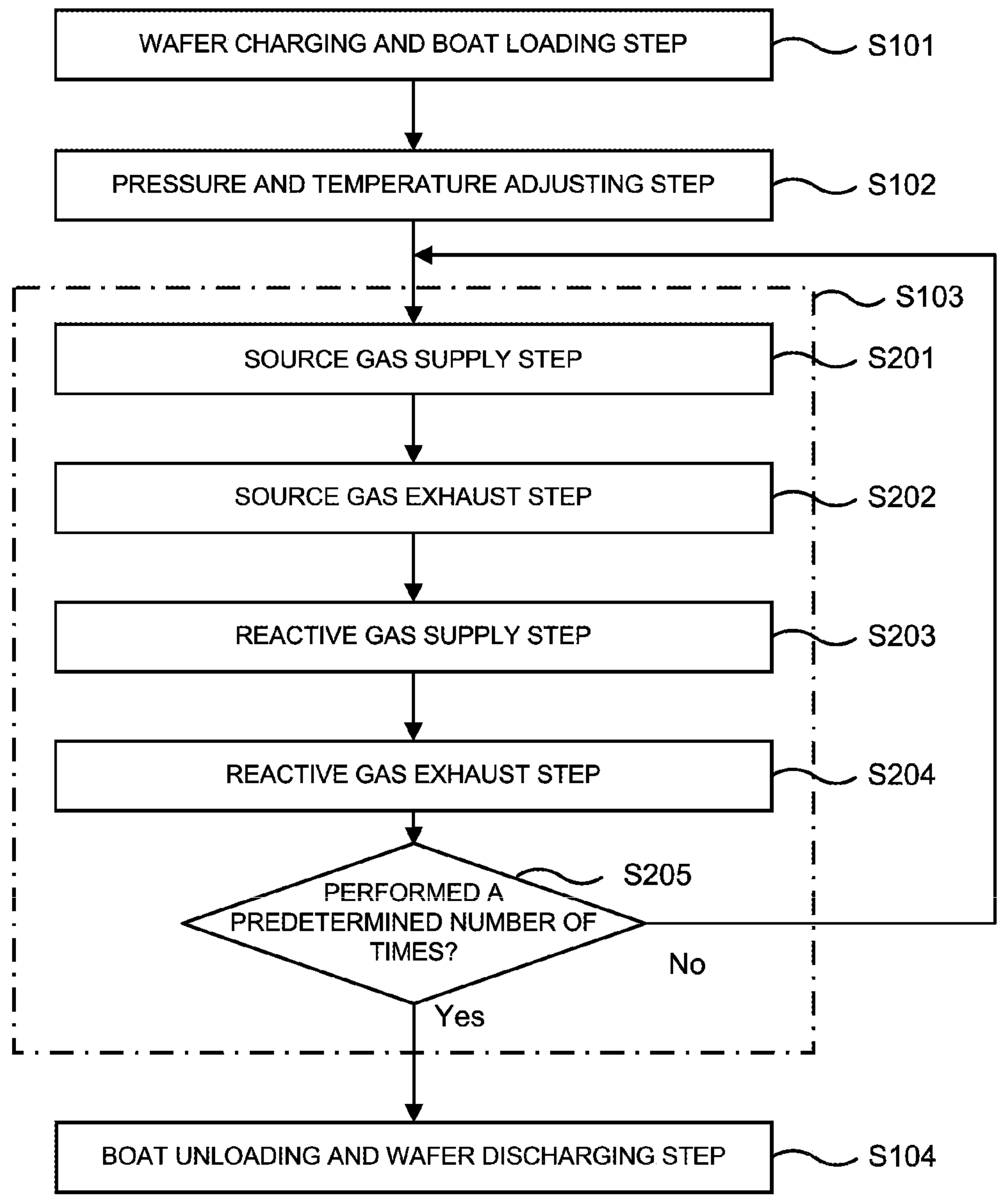
FIG. 17 is a flow diagram of a film-forming process according to the first embodiment.

Next, a process for forming a film on a substrate using the above-described processing apparatus 2 will be described with reference to FIG. 17. The process is one of the processes for manufacturing a semiconductor device. According to the first embodiment, a silicon oxide ($SiO_2$) film is deposited on the wafer W by supplying DCS ($SiH_2Cl_2$: dichlorosilane) gas as a source gas to the wafer W and supplying oxygen ($O_2$) gas as a reactive gas. In the following description, the controller 100 controls the operations of components of the processing apparatus 2.

<Wafer Charging and Boat Loading Step S101>

After the boat 26 is charged with a plurality of wafers W (wafer charging step), the boat 26 is loaded into the process chamber 14 by the boat elevator 32 (boat loading step). The opening at the lower end of the reaction tube 10 is airtightly sealed by the lid 22. $N_2$ gas, which is the purge gas, is supplied into the gap between the lid 22 and the insulating structure 24 by the furnace opening purge gas supply unit.

$N_2$ gas is continuously supplied by the furnace opening purge gas supply unit at least until the film-forming process is complete.

<Pressure and Temperature Adjusting Step S102>

The vacuum pump 52 vacuum-evacuates (depressurizes and exhausts) the inside of the process chamber 14 until the inner pressure of the process chamber 14 reaches a predetermined pressure (vacuum level). The inner pressure of the process chamber 14 is measured by the pressure sensor 48 and the APC valve 50 is feedback-controlled based on the measured pressure. The heater 12 is configured to heat the process chamber 14 until the temperature of the wafer W in the process chamber 14 reaches a predetermined temperature. At this time, the energization state of the heater 12 is feedback-controlled based on the temperature detected by the temperature-detecting unit 16 such that the temperature of the process chamber 14 satisfies a predetermined temperature distribution. The rotating mechanism 30 starts to rotate the boat 26 and the wafer W.

<Film-Forming Process S103>

<Source Gas Supply Step S201>

When the temperature of the process chamber 14 is stabilized at a predetermined processing temperature, DCS gas is supplied to the wafer W in the process chamber 14. The flow rate of the DCS gas is adjusted to a desired flow rate by the MFC 38*a*. The DCS gas having the flow rate thereof adjusted is supplied into the process chamber 14 via the gas supply pipe 36*a* and the gas nozzle 44*a*. Simultaneously, $N_2$ gas is supplied to the furnace opening by the furnace opening purge gas supply unit to locally purge a portion of the furnace opening, in particular, the periphery of the base of the gas nozzle. As a result, the concentration of the source gas is reduced in this region. When performing the source gas supply step, the flow rate of $N_2$ gas supplied by the furnace opening purge gas supply unit may be temporarily increased.

<Source Gas Exhaust Step S202>

Next, the supply of the DCS gas is stopped, and the vacuum pump 52 vacuum-exhausts the inside of the process chamber 14. Simultaneously, $N_2$ gas, which is an inert gas, may be supplied into the process chamber 14 through the inert gas supply unit (purge by inert gas).

<Reactive Gas Supply Step S203>

Next, $O_2$ gas is supplied to the wafer W in the process chamber 14. The flow rate of the $O_2$ gas is adjusted to a desired flow rate by the MFC 38*b*. The $O_2$ gas having the flow rate thereof adjusted is supplied into the process chamber 14 via the gas supply pipe 36*b* and the gas nozzle 44*b*. Simultaneously, the $N_2$ gas is supplied to the furnace opening by the furnace opening purge gas supply unit to locally purge the periphery of the base of the gas nozzle. As a result, the concentration of the reactive gas is reduced in this region <Reactive Gas Exhaust Step S204>

Next, the supply of the $O_2$ gas is stopped, and the vacuum pump 52 vacuum-exhausts the inside of the process chamber 14. Simultaneously, $N_2$ gas may be supplied into the process chamber 14 through the inert gas supply unit (purge by inert gas).

By performing a cycle including the four steps described above a predetermined number of time (one or more times) (S205), a $SiO_2$ film having a predetermined composition and a predetermined thickness may be formed on the wafer W.

<Boat Unloading and Wafer Discharging Step S104>

After the film having the predetermined film thickness is formed, $N_2$ gas is supplied by the inert gas supply unit to replace the inner atmosphere of the process chamber 14 with $N_2$ gas, and the pressure of the process chamber 14 is returned to atmospheric pressure. The lid 22 is then lowered by the boat elevator 32 and the boat 26 is unloaded from the reaction tube 10 (boat unloading). Thereafter, the processed wafer W is discharged from the boat 26 (wafer discharging).

The process conditions for forming the $SiO_2$ film on the wafer W are as follows:

Temperature (wafer temperature): 300° C. to 700° C.;

Pressure (the inner pressure of the process chamber): 1 Pa to 4000 Pa;

DCS gas: 100 sccm to 10000 sccm;

$O_2$ gas: 100 sccm to 10000 sccm; and $N_2$ gas: 100 sccm to 10000 sccm.

By selecting suitable values within these process conditions, the film-forming process may be performed properly.

Effects of the First Embodiment

The first embodiment may provide one or more advantageous effects described below.

(1) By intensively supplying the purge gas to the region with high gas concentration, the gas may be efficiently diluted to reduce the concentration thereof and the adhesion of the by-products may be suppressed. As a result, generation of particles may be suppressed, and productivity may be improved.

(2) By installing the restrictor in the gap between the insulating structure and the lid, the flow of the purge gas which purges the furnace opening may be guided and the furnace opening may be locally purged. Since it is not necessary to increase the flow rate of the purge gas more than necessary, the purge gas may be prevented from adversely affecting the wafer processing and the film quality may be improved.

(3) By installing the restrictor on the lid cover, additional components are not required to locally purge the furnace opening. Therefore, the complexity of the configuration of the processing apparatus may be reduced, and the increase in cost may be suppressed.

Figure 9:
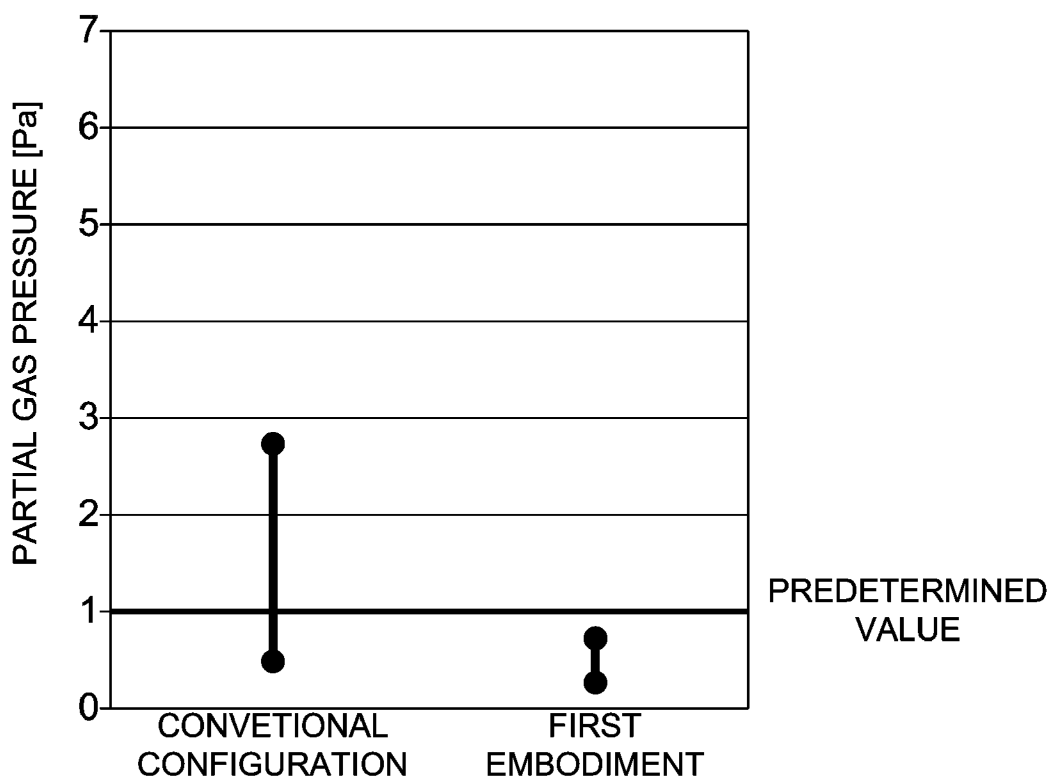
FIG. 9 illustrates concentration distributions at the furnace opening according to the first embodiment and the conventional furnace opening.

As shown in FIG. 9, according to conventional configuration, the partial gas pressure (gas concentration) at the furnace opening is broadly distributed. The partial gas pressure (gas concentration) at the furnace opening is higher than the predetermined value. Contrarily, according to the first embodiment, the partial gas pressure (gas concentration) is lower than the predetermined value throughout the furnace opening.

While the first embodiment described in detail, the technique described herein is not limited to the first embodiment, and various modifications may be made without departing from the scope thereof.

First Modified Example

Figure 10:
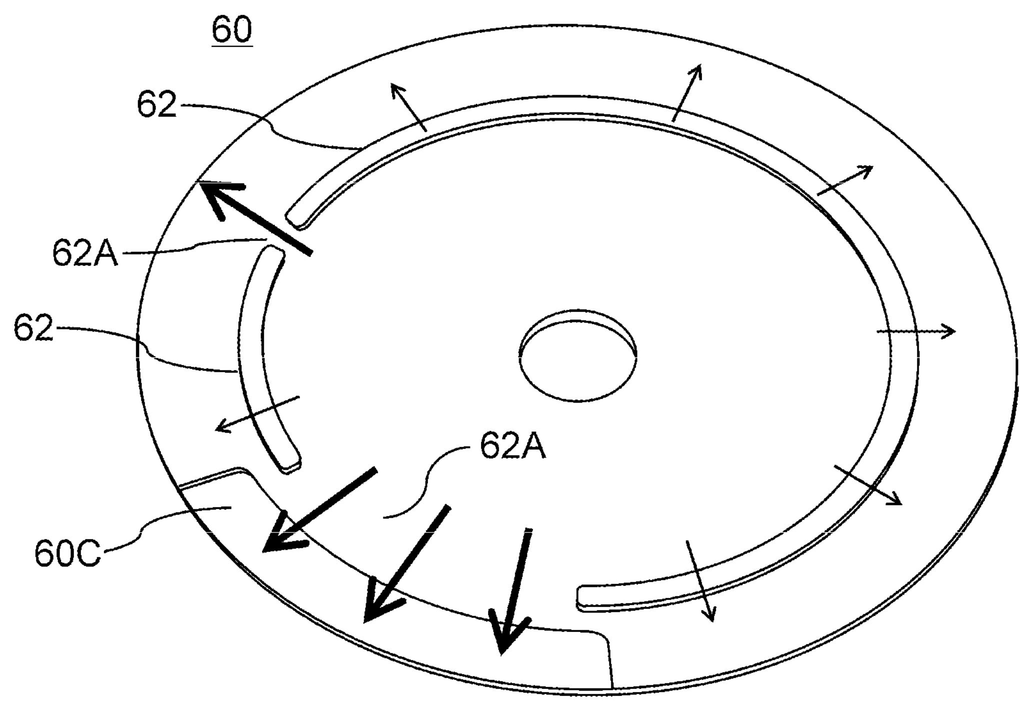
FIG. 10 illustrates a first modified example of the first embodiment.

As shown in FIG. 10, the notch 62A may be provided at a plurality of locations as well as a single location. That is, the purge gas may be guided by the plurality of notches 62A toward a region at the furnace opening where the gas is stagnated or a region with high gas concentration to locally purge the regions. Accordingly, the entirety of the furnace opening may be purged. As a result, the gas concentration may be more efficiently maintained at a concentration lower than the predetermined value throughout the furnace opening, and the adhesion of by-products may be suppressed.

Second Modified Example

Figure 11:
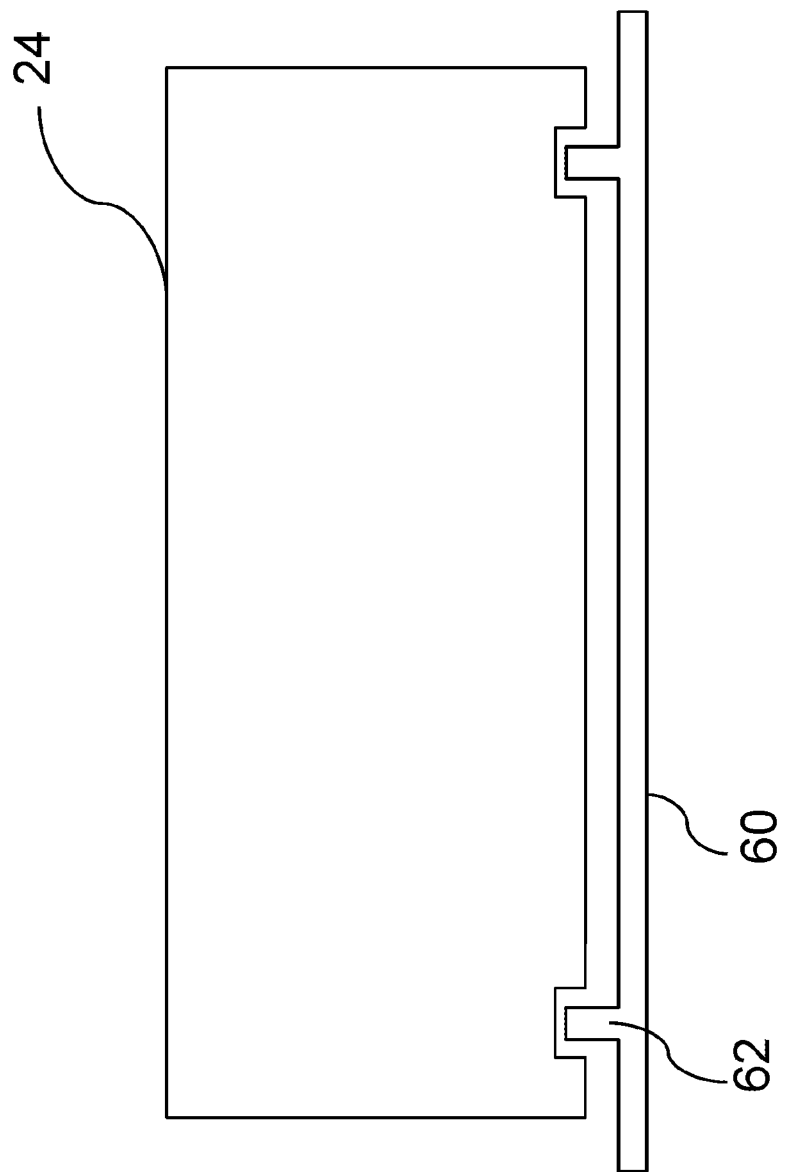
FIG. 11 is a side view illustrating a second modified example of the first embodiment.
Figure 12:
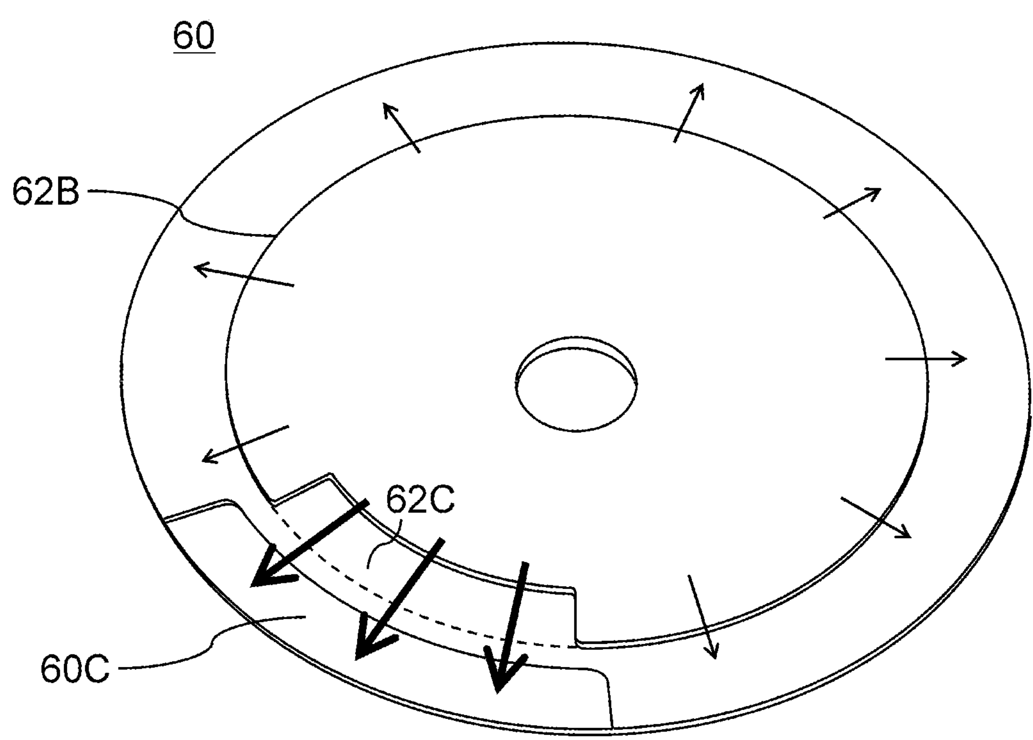
FIG. 12 is a perspective view illustrating the second modified example of the first embodiment.

As shown in FIG. 11, a recess having a width greater than that of the restrictor 62 may be provided on the lower surface of the insulating structure 24 at a position corresponding to that of the restrictor 62. The upper end of the restrictor 62 may be inserted into the recess. The restrictor 62 may be provided on the lower surface of the insulating structure 24 to protrude downward toward the lid instead of being provided on the lid cover 60. When the restrictor 62 is provided on the lower surface of the insulating structure 24, the recess may be provided on the lid cover 60 at a position corresponding to that of the restrictor 62 to engage with the restrictor 62. When the recess is provided, the flow path of the purge gas has a crank shape. As a result, the restrictor 62 may regulate the flow of the purge gas more efficiently with a crank-shaped gap compared to a straight gap of the same width. The width of the gap may be increased to more effectively regulate the flow of the purge gas, and a larger margin (clearance) may be obtained. However, the restrictor 62 alone, when provided in the rotating insulating structure 24, may not be capable of regulating the flow of the purge gas in a particular direction. The restrictor may be provided on the lower surface of the insulating structure 24 over the entire circumference thereof, and a circular protrusion 62B engaged with the restrictor may be provided on the surface of the lid cover 60 as shown in FIG. 12. The circular protrusion 62B is provided with a countersink 62C for relieving the regulation of the gas flow. The countersink 62C is a notch formed by removing a portion of the circular protrusion 62B. Since the gap between the restrictor and the circular protrusion 62B is larger at the countersink 62C, meandering of the flow path is eliminated and the flow rate is locally increased.

Third Modified Example

The flow rate of the purge gas may be increased or decreased while performing the steps of the film-forming process. By increasing the flow rate, localized purging may be enhanced. For example, the flow rate of the purge gas supplied to purge the furnace opening in the source gas supply step may be higher than that of the purge gas supplied to purge the furnace opening in the reactive gas supply step. With this configuration, the portion that is difficult to be purged may be efficiently purged.

Fourth Modified Example

Figure 13:
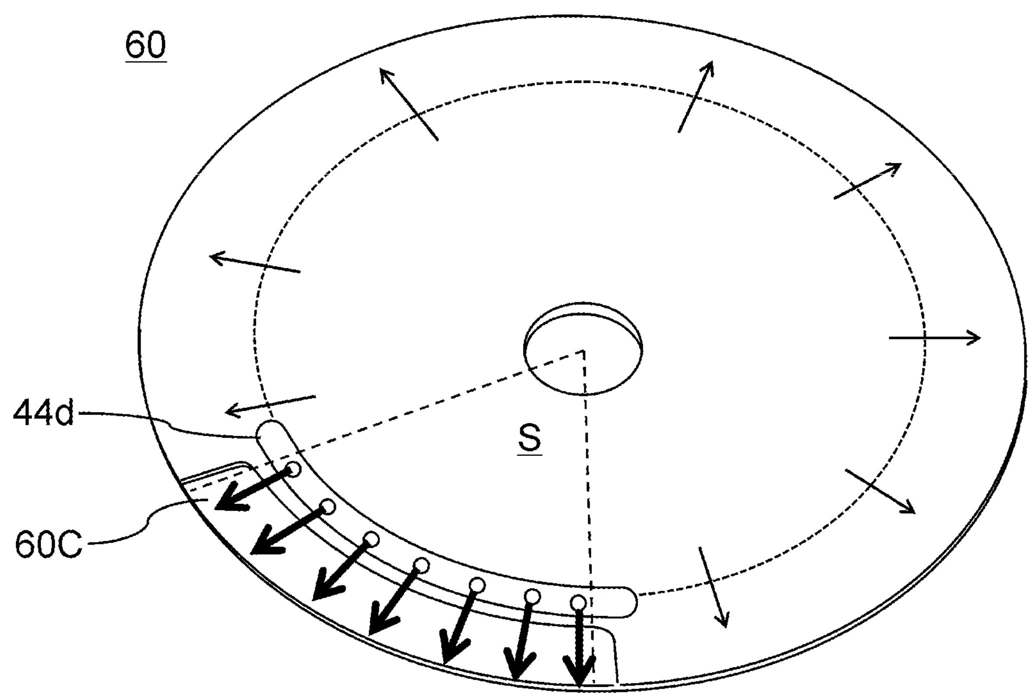
FIG. 13 illustrates a fourth modified example of the first embodiment.

As shown in FIG. 13, a gas supply nozzle **44*d* may be provided instead of the notch 62A at the base of the gas nozzle to locally supply purge gas. That is, the gas supply nozzle 44*d* may be provided at a position facing the base of the gas nozzle. The gas supply nozzle 44*d* may include a pipe having a plurality of holes. Preferably, the plurality of holes may be accommodated within a sector S. Both the gas supply nozzle 44*d* and the notch 62**A may be provided.

Next, a second embodiment will be described. The second embodiment differs from the first embodiment in that the furnace opening and the inside of the insulating structure 24 are purged by the purge gas and the gas nozzle is provided in a buffer chamber.

Figure 14:
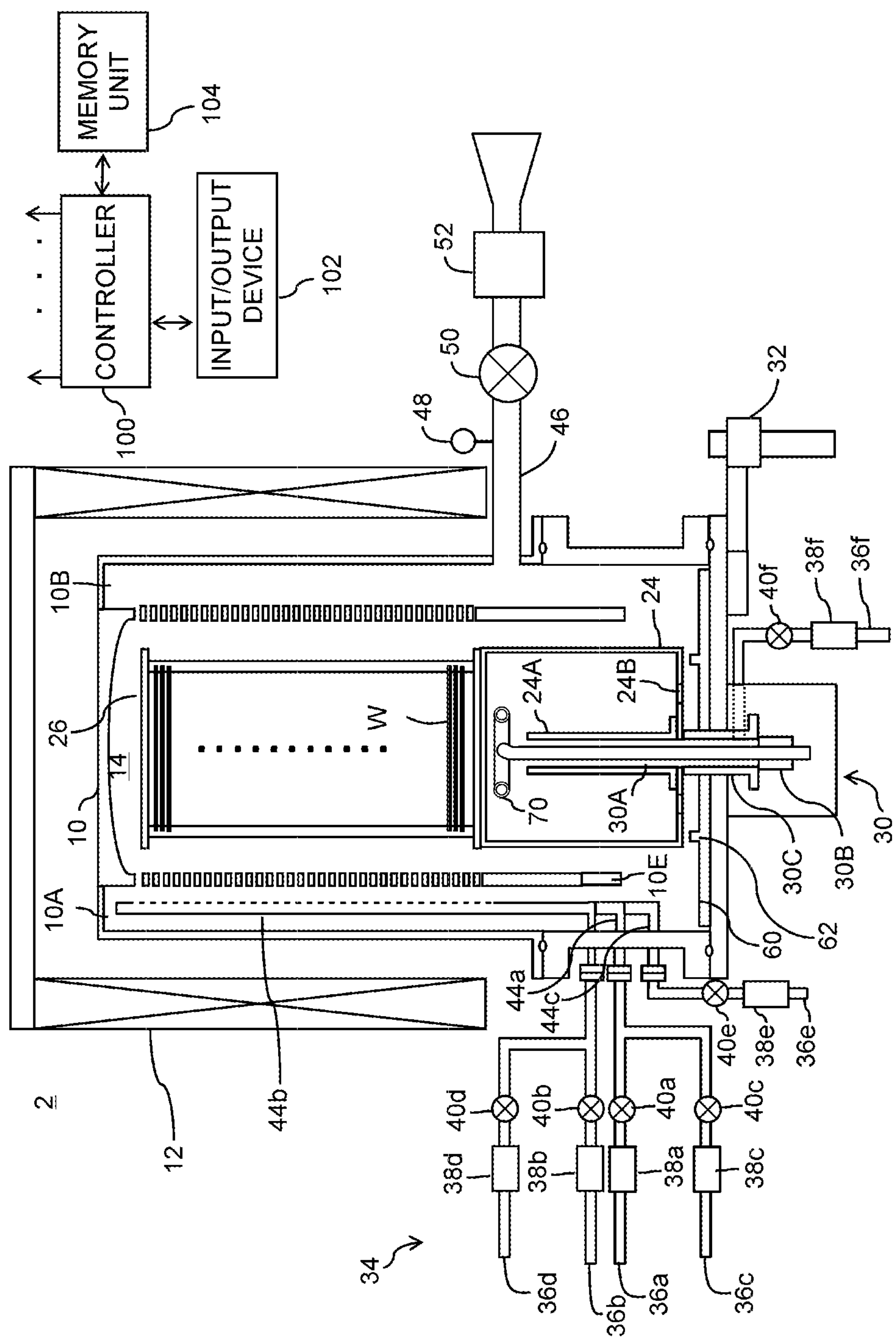
FIG. 14 schematically illustrates a vertical cross-section of a substrate processing apparatus according to a second embodiment.
Figure 15:
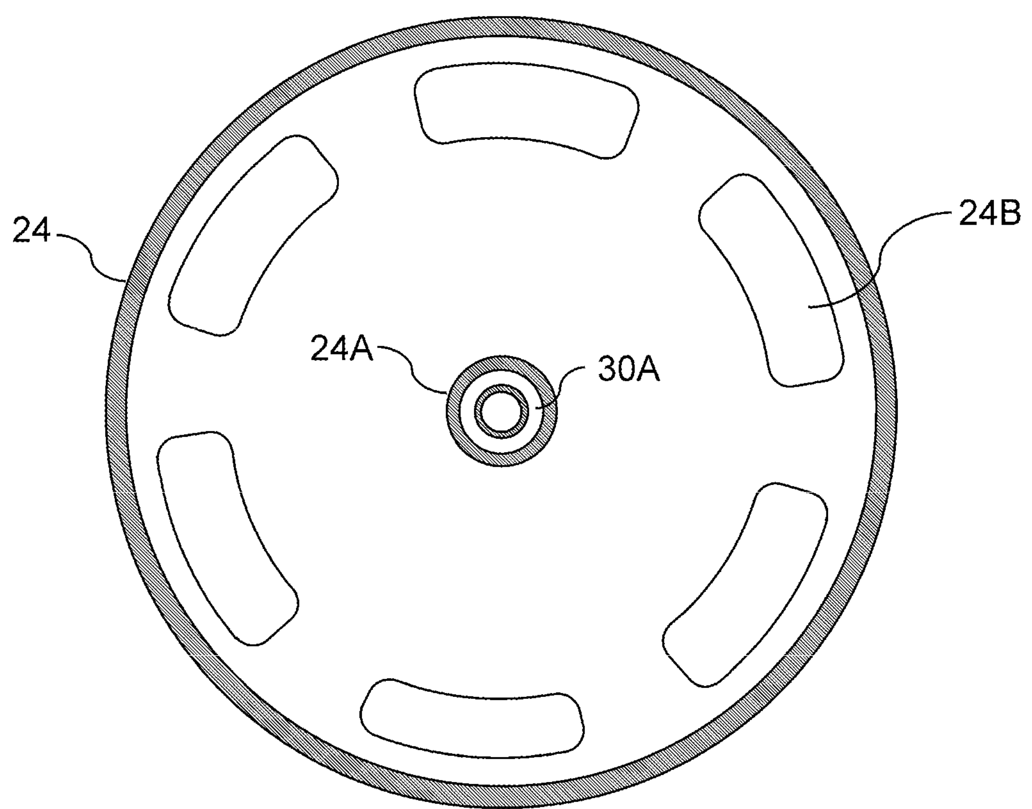
FIG. 15 is a cross-sectional view of an insulating structure of the substrate processing apparatus according to the second embodiment.

As shown in FIG. 14, a supply buffer chamber 10A and a exhaust buffer chamber 10B are provided to face the reaction tube 10 and to protrude toward the outside of the reaction light 10. Each of the interior of the supply buffer chamber 10A and the interior of the exhaust buffer chamber 10B are partitioned into a plurality of sections by a partition wall (not shown). Gas nozzles **44*a*, 44*b* and 44*c* are respectively provided in each section of the supply buffer chamber 10A. A plurality of slits are provided on side wall of each of the supply buffer chamber 10A and the exhaust buffer chamber 10B to face the process chamber 14. An opening 10E is provided below the side wall of the supply buffer chamber 10A. The width of the opening 10E is substantially equal to that of the supply buffer chamber 10A. Since the gas nozzles 44a, 44b and 44c should be inserted the supply buffer chamber 10A, it is difficult to eliminate the gap between the bases of the gas nozzles 44a, 44b and 44c and opening 10E. Thus, gases such as the reactive gas flow out of the supply buffer chamber 10**A through the gap.

The insulating structure 24 accommodates therein a sub-heater 70 (second heating means). The sub-heater 70 is inserted in an outer shaft 30C of the rotating mechanism 30 and is supported by an inner shaft 30B. The outer shaft 30C supports and rotates the insulating structure 24 while the inner shaft 30B only supports the sub-heater 70 and does not rotate. A hollow insulating structure support column 24A is provided in the insulating structure 24 so as to surround the support column of the sub-heater 70. The hollow portion 30A consists of a gap between the support column of the sub-heater 70 and the outer shaft 30C and a gap between the support column of the sub-heater 70 and the insulating structure support column 24A. The furnace opening purge gas supply unit is spatially connected to the hollow portion 30A. By supplying purge gas into the hollow portion 30A, the interior of the insulating structure 24 is purged.

The purge gas is supplied into the insulating structure 24 via the hollow portion 30A. After purging the interior of the insulating structure 24, the purge gas is exhausted through vent holes 24B provided in the lowermost surface of the insulating structure 24 and a gap between the lid cover 60 and the insulating structure 24. The air vent 24B is configured to exhaust the interior of the insulating structure 24 and to supply purge gas to the furnace opening. As shown in FIG. 14, the vent holes 24B are provided at equal intervals at the lowermost surface of the insulating structure 24 along a circumference of a circle concentric with the insulating structure 24

The radius of the restrictor 62 is larger than circumradius of the circumcircle of the vent holes 24B. Preferably, the diameter of the restrictor 62 is equal to or smaller than the outer diameter of the insulating structure 24 or slightly greater than the outer diameter of the insulating structure 24. When the radius of the restrictor 62 is smaller than the circumradius of the circumcircle of the vent holes 24B, the restrictor 62 may not regulate the flow path of the purge gas from the vent hole 24B to the furnace opening such that the purge gas flows directly from the vent hole 24B to the furnace opening, resulting in inability to locally purge the furnace opening. When the diameter of the restrictor 62 is excessively large, a gap or a meadering path may not be provided between the restrictor 62 and the insulating structure 24.

Similar to the first embodiment shown in FIG. 2, a notch 62A is provided in a sector region S defined by lines connecting both ends of the region of high gas concentration and the center of the lid 22 (the center of the lid cover 60). Since the region with high gas concentration is the opening 10E in the second embodiment, the notch 62A is provided in the sector area S defined by the lines connecting the both ends of the opening 10E and the center of the lid cover 60. According to the second embodiment, the gas concentration of the supply buffer chamber 10A is higher than that of the process chamber because the gas nozzle is provided in the supply buffer chamber 10A. Therefore, the opening 10E is locally and extensively purged to reduce the gas concentration. As a result, the adhesion of by-products the furnace opening may be prevented.

While embodiments wherein DCS gas as the source gas are exemplified above, the above-described techniques are not limited thereto. The above-described technique may also be applied when inorganic halosilane source gases such as HCDS ($Si_2Cl_6$: hexachlorodisilane) gas, MCS ($SiH_3Cl$: monochlorosilane) gas and TCS ($SiHCl_3$: trichlorosilane) gas, amine-based silane source gases free of halogen such as 3DMAS ($Si[N(CH_3)_2]_3H$: tris(dimethylamino)silane) gas, BTBAS ($SiH_2[NH(C_4H_9)]_2$: bis(tertiarybutylamino)silane) and inorganic halosilane sources gases free of halogen such as MS ($SiH_4$: monosilane) gas and DS ($Si_2H_6$: disilane) gas are used as the source gas.

While embodiments wherein $SiO_2$ film is formed are exemplified above, the above-described technique is not limited thereto. The above-described technique may also be applied to formations of films such as SiN film, SiON film, SiOCN film, SiOC film, SiCN film, SiBN film and SiBCN film using a nitrogen-containing gas such as ammonia ($NH_3$) gas, a carbon-containing gas such as propylene ($C_3H_6$) gas and a boron-containing gas such as boron trichloride ($BCl_3$) gas as well as the formation of $SiO_2$ film. By forming the films under the same process conditions as the above-described embodiments, the same advantageous effects as those of the above-described embodiments may be obtained.

Preferably, the above-described technique may be applied to a formation of a film containing a metal element (metal-based film) such as titanium (Ti), zirconium (Zr), hafnium (Hf), tantalum (Ta), niobium (Nb), aluminum (Al), molybdenum and tungsten (W).

While embodiments wherein a film is deposited on a wafer W are exemplified above, the above-described technique is not limited thereto. Preferably, the above-described technique may also be applied when a wafer W or a film formed on the wafer W is subjected to processes such as an oxidation process, a diffusion process, an annealing process and an etching process.

The above-described embodiments and modified examples may be appropriately combined. The process condition used in the combinations may be the same as, for example, those of the above embodiments or modified examples.

According to the above-described technique, by-products may be prevented from adhering to the lower portion of the process vessel.

What is claimed is:

1. A substrate processing apparatus comprising:

a process vessel including a process chamber wherein a plurality of substrates are processed;

a lid configured to close a lower end opening of the process vessel;

a substrate retainer configured to accommodate the plurality of substrates in the process chamber;

an insulating structure disposed between the lid and the substrate retainer;

a rotation axis configured to rotatably support the insulating structure and maintain a gap spaced between the lid and the insulating structure;

a process gas supplier configured to supply a process gas into the process vessel;

an annular purge gas port located around the rotation axis and configured to supply a purge gas to the gap where the gap guides the purge gas to flow outward and radially around the rotation axis through the gap into a lower region of the process vessel; and a lid cover disposed on an upper surface of the lid and comprising a restrictor that narrows the gap in part of a circumference, wherein the restrictor is configured to regulate a flow of the purge gas such that a flow rate or a conductance of the purge gas supplied to a first portion of the lower region of the process vessel is greater than a flow rate or a conductance of the purge gas supplied to a second portion of the lower region of the process vessel other than the first portion.

2. The substrate processing apparatus of claim 1, wherein the lid cover is made of a corrosion-resistant material, wherein the restrictor is an open circular shape and a notch is created by an open-ended portion of the restrictor.

3. The substrate processing apparatus of claim 2, wherein the process gas supplier comprises a gas nozzle having a base disposed in the first portion of the lower region of the process vessel, so that the process gas is purged from near the base and flows through the second portion of the lower region of the process vessel.

4. The substrate processing apparatus of claim 3, further comprising an exhaust port disposed in the second portion of the lower region of the process vessel and connected to a vacuum pump.

5. The substrate processing apparatus of claim 4, wherein the substrate retainer and the insulating structure are rotatable with respect to the lid.

6. The substrate processing apparatus of claim 2, wherein a bottom surface of the insulating structure includes a recess formed in a circular shape at a position corresponding to that of the restrictor.

7. The substrate processing apparatus of claim 2, further comprising an exhaust port disposed in the second portion of the lower region of the process vessel for exhausting the process gas, wherein the restrictor opens to a direction opposite to the exhaust port.

8. The substrate processing apparatus of claim 2, wherein the lower region of the process vessel includes a periphery of the insulating structure.

9. The substrate processing apparatus of claim 1, wherein the restrictor protrudes upward from an upper surface of the lid cover to extend toward the gap.

* * * * *